US009029879B2

(12) United States Patent
Mei et al.

(10) Patent No.: US 9,029,879 B2
(45) Date of Patent: *May 12, 2015

(54) PHOSPHOR CAP FOR LED DIE TOP AND LATERAL SURFACES

(71) Applicant: LedEngin, Inc., San Jose, CA (US)

(72) Inventors: Zequn Mei, Fremont, CA (US); Truc Phuong Thi Vu, San Jose, CA (US); Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 13/714,399

(22) Filed: Dec. 13, 2012

(65) Prior Publication Data

US 2014/0167075 A1    Jun. 19, 2014

(51) Int. Cl.
*H01L 33/50* (2010.01)

(52) U.S. Cl.
CPC ......... *H01L 33/50* (2013.01); *H01L 2933/0041* (2013.01)

(58) Field of Classification Search
CPC ..... H01L 33/50; H01L 33/501; H01L 33/502; H01L 33/505; H01L 33/507; H01L 33/508; H01L 2933/0041
USPC ............................................... 438/29; 257/88
See application file for complete search history.

(56) References Cited

U.S. PATENT DOCUMENTS

| | | | |
|---|---|---|---|
| 6,650,044 B1 * | 11/2003 | Lowery | 313/502 |
| 7,049,159 B2 * | 5/2006 | Lowery | 438/22 |
| 8,399,268 B1 | 3/2013 | Mei et al. | |
| 2006/0170332 A1 * | 8/2006 | Tamaki et al. | 313/498 |
| 2007/0178629 A1 * | 8/2007 | Ogawa et al. | 438/113 |
| 2010/0252845 A1 * | 10/2010 | Lin et al. | 257/98 |
| 2012/0068209 A1 * | 3/2012 | Andrews | 257/98 |

OTHER PUBLICATIONS

Notice of Allowance for U.S. Appl. No. 13/338,936, mailed Jan. 22, 2013, 8 pages.
Requirement for Restriction/Election for U.S. Appl. No. 13/338,936, mailed of Nov. 23, 2012, 4 pages.

* cited by examiner

*Primary Examiner* — Michael Lebentritt
*Assistant Examiner* — Jordan Klein
(74) *Attorney, Agent, or Firm* — Kilpatrick Townsend & Stockton LLP (57) ABSTRACT

A method for depositing a layer of phosphor-containing material on a plurality of LED dies includes disposing a template with a plurality of openings on an adhesive tape and disposing each of a plurality of LED dies in one of the plurality of openings of the template. The method also includes forming a patterned dry film photoresist layer over the template and the plurality of LED dies. The photoresist layer has a plurality of openings configured to expose a top surface and side surfaces of each of the LED dies. Next, a phosphor-containing material is disposed on the exposed top surface of each the LED dies. The method further includes removing the photoresist layer and the template.

18 Claims, 11 Drawing Sheets

PHOSPHOR CAP FOR LED DIE TOP AND LATERAL SURFACES

CROSS-REFERENCES TO RELATED APPLICATIONS

This application is related to U.S. patent application Ser. No. 13/338,912, filed Dec. 28, 2011, Titled "DEPOSITION OF PHOSPHOR ON DIE TOP BY STENCIL PRINTING", and U.S. patent application Ser. No. 13/338,936, filed Dec. 28, 2011, Titled "DEPOSITION OF PHOSPHOR ON DIE TOP USING DRY FILM PHOTORESIST", both of which are commonly owned and incorporated herein by reference in its entirety.

BACKGROUND OF THE INVENTION

The present invention relates in general to light-emitting diodes (LEDs) and in particular to deposition of phosphor-containing material on LED dies for light color selection.

With the incandescent light bulb producing more heat than light, the world is eager for more efficient sources of artificial light. LEDs are a promising technology and are already widely deployed for specific purposes, such as traffic signals and flashlights. For colored light, an LED chip is often combined with a wavelength-converting material to obtain desired output light color. For example, yellow phosphors are often combined with blue LEDs to produce white light. However, the development of LED-based lamps for general illumination has run into various difficulties. Among these is the difficulty of mass-producing LED emitters with phosphors that provide a consistent light color.

Conventional LED emitters often include an LED die in a recess or cup structure that has phosphor-containing material in the cup. In some cases, the phosphor-containing material is separated from the LED die by, for example, a silicone material. These conventional methods tend suffer from many drawbacks. For example, conventional methods often use a large amount of phosphor, and they may cause poor cooling of the phosphor and the silicone material. As a result, the emitter can suffer from less reliable packaging and non-uniform angular distribution of light color. Given existing processes for LED manufacture, mass-producing white LEDs with a consistent color temperature has proven to be a challenge.

BRIEF SUMMARY OF THE INVENTION

Embodiments of the present invention relate to methods for placing controlled amount of phosphor-containing material on top of LED dies. In some embodiments, a plurality of LED dies are placed in openings of a template. The phosphor-containing material of suitable viscosity is applied, e.g., by printing, and then excess material is removed using the template as a guide. The size of the opening limits the phosphor-containing material to only the exposed top surface of the LED dies, and the height of the template help control the thickness of the phosphor-containing material. A patterned photoresist can be used to mask out areas of the die where no phosphor-containing material is desired.

The methods described herein have many advantages can be achieved over conventional techniques. The methods use conventional equipment and processes and are suitable for cost-effective mass production. The phosphor usage is reduced, since phosphor is placed only on the top surface of the LED die. Heat generated in the phosphor material can be dissipated through the LED die, and better cooling can reduce the temperature of the phosphor and the silicone material and lead to more reliable package. In contrast, a conventional method of placing phosphor on die top involves using a syringe to place liquid droplets of phosphor material. One drawback of this method is that the liquid mixture tends to settle and can lead to color shifting. In the methods according to the present invention, the mixture of phosphor-containing material is formed to desired viscosity before being applied to the template.

According to some embodiments of the present invention, a method for depositing a layer of phosphor-containing material on a plurality of LED (light-emitting diode) dies includes disposing a template of photoresist material with a plurality of openings on an adhesive substrate and disposing each of a plurality of LED dies in one of the plurality of openings of the template. The method also includes forming a photoresist layer over the template and the plurality of LED dies and patterning the photoresist layer to form a plurality of openings aligned with the plurality of openings in the template and configured to expose a top surface and surrounding side surfaces of each of the LED dies. The method also includes depositing a phosphor-containing material on the exposed top surface and surrounding side surfaces of each the LED dies such that a top surface of the phosphor-containing material is even with a top surface of the photoresist layer. Further, the patterned photoresist layer and the template are removed such that the plurality of LED dies remains on the adhesive substrate, with the phosphor-containing material covering the top surface and surrounding side surfaces of each of the LED dies.

In an embodiment of the above method, a sum of the thickness of the template and the thickness of the photoresist layer is equal to a desired thickness of the phosphor-containing material on top of the LED dies. In another embodiment, a lateral dimension of each of the plurality of openings is chosen to allow a desired thickness of the phosphor-containing material on the side surfaces of the LED dies.

In another embodiment of the above method, disposing a template of photoresist material includes the following steps:
  disposing a layer of dry film photoresist sandwiched between a top and a bottom protective films on a glue side of a single-sided support adhesive tape;
  patterning the layer of dry film resist using a photomasking process;
  attaching the patterned dry film to the adhesive substrate; and
  removing the bottom support film and the support adhesive tape from the patterned dry film resist, and leaving the template of patterned dry film resist on the adhesive substrate.

In an embodiment, patterning the layer of dry film resist includes the following steps:
  disposing a photomask over the layer of dry photoresist film;
  exposing the dry photoresist film with a light source;
  removing the top protective film; and
  developing the exposed dry photoresist film to form the plurality of openings.

In another embodiment of the above method, removing the patterned photoresist layer and the template comprising using a photoresist stripping solution. In another embodiment, the adhesive substrate includes an adhesive tape disposed on a glass plate. In another embodiment, the support adhesive tape is a heat release tape. In yet another embodiment, the support adhesive tape is a UV release tape. In another embodiment, an area of each of the openings in the template is approximately equal to the size of the LED dies plus the thickness of the phosphor-containing material on the side surfaces of the LED dies.

In other embodiments of the above method, the patterned photoresist layer is configured to cover bond pad areas on the LED dies. In another embodiment, each of the plurality of LED dies is disposed with a front side face down in one of the plurality of openings of the template, wherein the front side of the die include bond pad regions. In still another embodiment, n depositing the phosphor-containing material includes depositing the phosphor-containing material on the patterned photoresist layer and the LED dies and removing excess phosphor-containing material from the top surface of the photoresist layer and on the top surface of the LED dies that protrudes above the top surface of the patterned photoresist layer. In another embodiment, the phosphor-containing material in the plurality of openings comprises using a screen printing process.

According to other embodiments of the present invention, a method for depositing a layer of phosphor-containing material on a plurality of LED (light-emitting diode) dies includes disposing a first layer of dry film photoresist sandwiched between a top and a bottom protective films on a first adhesive tape which is mounted on a substrate and patterning the first layer of dry film resist using a photomasking process to form a plurality of openings. Then, the patterned first layer of dry film resist is attached to a second adhesive tape, and the bottom support film and the first adhesive tape are separated from the patterned dry film resist, leaving a template of patterned dry film resist on the second adhesive tape. The method also includes disposing each of a plurality of LED dies in one of the plurality of openings of the template. The method also includes disposing a second dry film resist on the template and the plurality of LED dies and patterning the second dry film resist to form a plurality of openings aligned with the plurality of openings in the template and configured to expose a top surface and surrounding side surfaces of each of the LED dies. Next, a phosphor-containing material is deposited on the exposed top surface and surrounding side surfaces of each the LED dies such that a top surface of the phosphor-containing material is even with a top surface of the photoresist layer. Then, the second dry film resist and the template are removed such that the plurality of LED dies remains on the adhesive substrate, with the phosphor-containing material covering the top surface and surrounding side surfaces of each of the LED dies.

In an embodiment of the above method, sum of the thickness of the template and the thickness of the photoresist layer is chosen to be the desired thickness of the phosphor-containing material on top of the LED dies. In another embodiment of the above method, a lateral dimension of each of the plurality of openings is chosen to allow a desired thickness of the phosphor-containing material on the side surfaces of the LED dies. In yet another embodiment, depositing the phosphor-containing material comprises using a screen printing process.

According to another embodiment of the present invention, a method for depositing a layer of phosphor-containing material on a plurality of LED (light-emitting diode) dies includes:
    forming a template structure on a substrate having an adhesive surface, the template structure having a plurality of openings with an LED die in each of the openings;
    forming a phosphor-containing material in the openings of the template structure and over a top surface of each the LED dies such that a top surface of the phosphor-containing material is substantially even with a top surface of the template structure; and
    removing the template,
    wherein a thickness of the template structure and spacing between the LED dies and the template structure are determined according to desired thicknesses of the phosphor-containing material on the top surface and lateral side surfaces of the LED dies.

In an embodiment of the above method, the template structure comprises photoresist material. In another embodiment, the template structure is configured to allow the template structure to be separated from the phosphor-containing material. In yet another embodiment, the template structure is configured to be chemically separated selectively from the phosphor-containing material. In still another embodiment, the template structure comprises a non-sticking surface that is configured to allow the template structure to be separated from the phosphor-containing material.

According to yet another embodiment, the present invention provides a structure that includes a plurality of separate LED dies attached to an adhesive tape, and each of the LED dies has a layer of phosphor-containing material over a top surface and side surfaces of the LED die.

According to yet another embodiment, the present invention provides a semiconductor device that includes an LED (light-emitting diode) die having a phosphor-containing material on a backside of the LED die. In another embodiment of the semiconductor device, the LED die also has the phosphor-containing material on side surfaces the LED die.

A further understanding of the nature and advantages of the present invention may be more appreciated by reference to the detailed description in the remaining portions of the specification and accompanying drawings that follow.

BRIEF DESCRIPTION OF THE DRAWINGS

FIGS. 1-16 are cross-sectional diagrams illustrating various methods for carrying out phosphor deposition according to embodiments of the present invention.

FIGS. 1-4 and 5A-5C illustrate a method for forming a patterned dry photoresist template for phosphor deposition according to an embodiment of the present invention;

DETAILED DESCRIPTION OF THE INVENTION

The description below will be made with reference to a series of drawing figures enumerated above. These diagrams are merely an example, which examples, and should not unduly limit the scope of the claims herein. In connection with the various aspects illustrated and described, one of ordinary skill in the art would recognize other variations, modifications, and alternatives.

Figure 1:
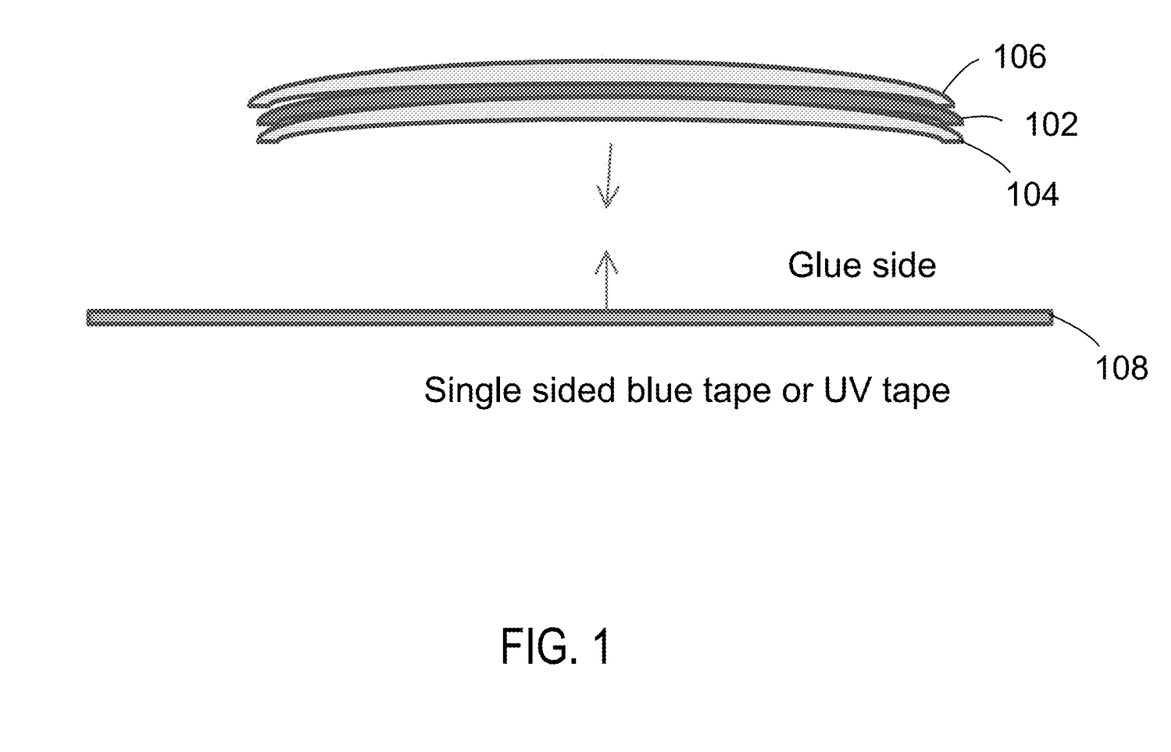

FIG. 1 shows a dry film photoresist 102 sandwiched between two release films, an inner release film 104 and an outer release film 106. The release films can be peeled off the dry film resist. As an example, the two release films can include a polyethylene film and a polyester film. In some embodiments, a commercially available dry film photoresist is used. For example, the Dupont, Riston series dry film resists have a thickness from 20 um to 100 um. The Dupont resist has negative tone and needs UV light source for lithography. In another example, the 416-DFR dry film resist from MG Chemicals are available thickness from 1.5 to 2 mils. The MG films are also negative tone, but they can use regular daylight fluorescent light bulb for lithography. As shown in FIG. 1, dry film photoresist 102 sandwiched between two release films 104 and 106 is laminated with an adhesive tape 108. In an embodiment, the adhesive tape is a single-sided blue tape or UV tape, whose adhesive strength is greatly reduced after blue light or UV light exposure.

Figure 2:
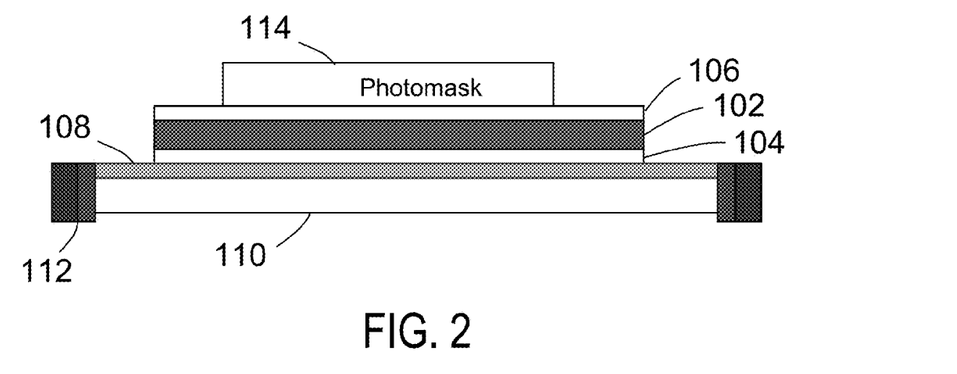

FIG. 2 shows adhesive tape 108 stretched over a glass disc or plate 110 with a grip ring over a grip ring 112. Thus, the laminated structure including dry film photoresist 102, release films 104 and 106, and adhesive tape 108 is ready to be patterned. As shown in FIG. 2, photomask 114 is disposed over the dry film resist layers. In some embodiments, photo mask 114 is a transparent film with the artwork printed on the film.

Figure 3:
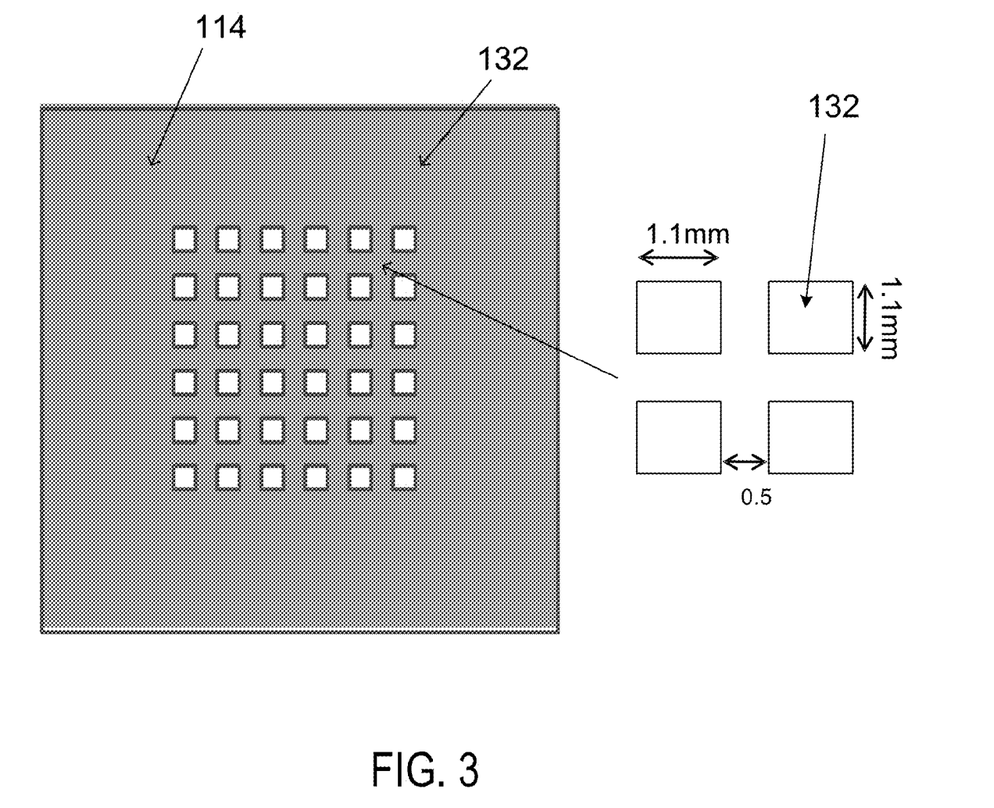

FIG. 3 shows an example of photomask 114, which includes openings arranged in a 6×6 array. However, depending on the application, the grid template can have other grid patterns, e.g. 30×30. In some embodiments, each of the openings is slightly larger than an LED chip's lateral size to allow space for a desired thickness of phosphor-containing material. As an example, assume the LED chips have a dimension of 1×1 mm$^2$, and the phosphor coating thickness of 0.05 mm on the chip lateral surfaces. Then the size of the openings are set as 1.1×1.1 mm$^2$.

Figure 8:
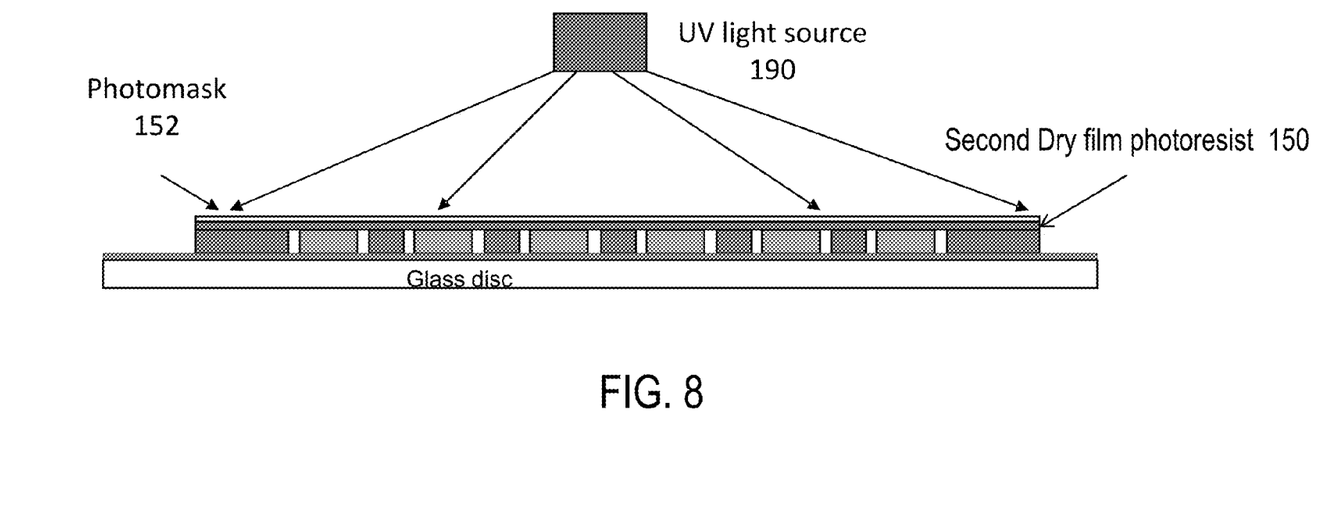

Next, the dry resist film is exposed. The ink side of photo mask 114 is in contact with the polyester cover 106 of dry film resist 102. A UV transparent glass or acrylic plate (not shown) is placed over the top of the photo mark, so that the photo mask can make a smooth and intimate contact with the polyester cover of the resist. The exposure can be carried out using a UV light source. For example, LED lamp Luxpot alta from LedEngin, San Jose, Calif., can provide 400 um UV light. An example illustrating the exposure process is shown in FIG. 8 described in a subsequent section. The exposure can be carried out for 20 minutes, for example. Subsequently, the photomask and the top support film are removed, and a post-exposure bake is performed to further assist cross links of the photoresist. The unexposed regions of the photoresist film are removed using a conventional resist development process.

Figure 4:
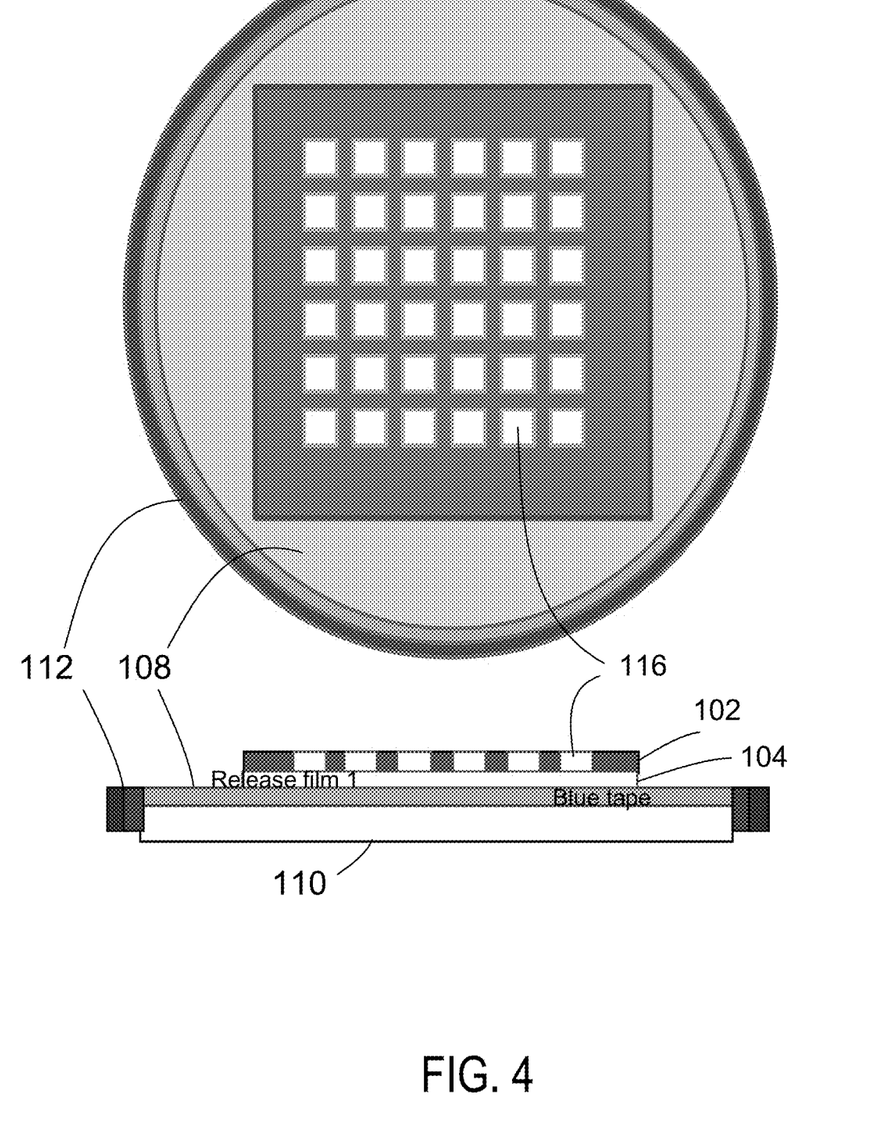

FIG. 4 shows a top view and a cross-sectional view of the patterned photoresist. In FIG. 4, patterned photoresist layer 102 with the bottom support film (also referred to as release film) 104 are attached to adhesive tape 108, which is stretched over glass substrate 110 with grip ring 112. The openings in patterned resist film 102 are marked by reference numeral 106.

Figure 5A:
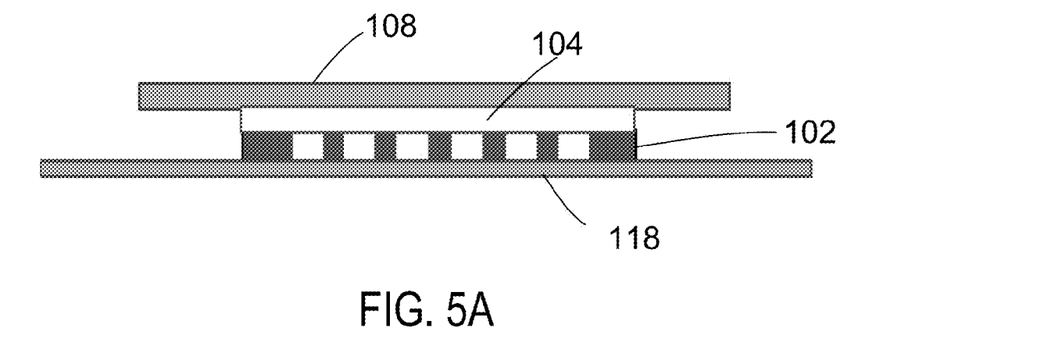
Figure 5B:
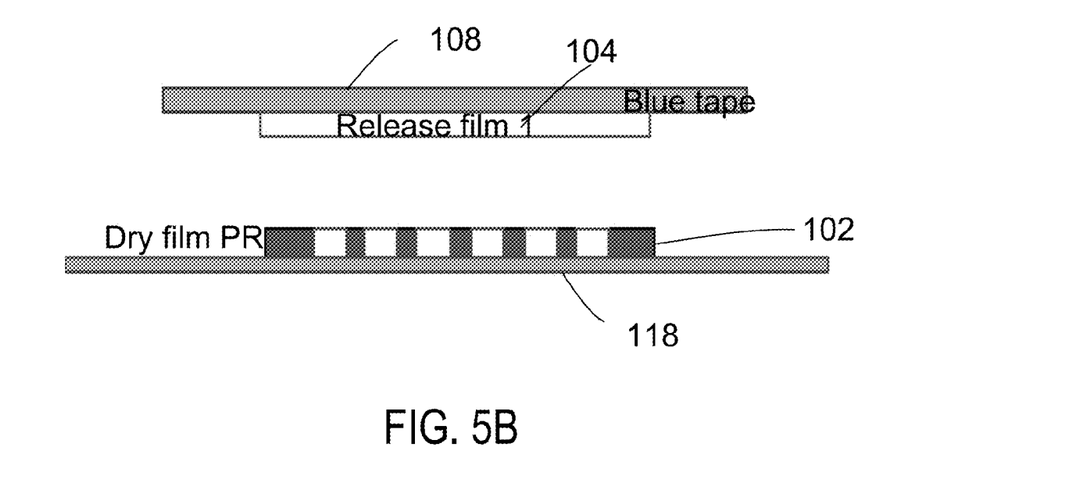
Figure 5C:
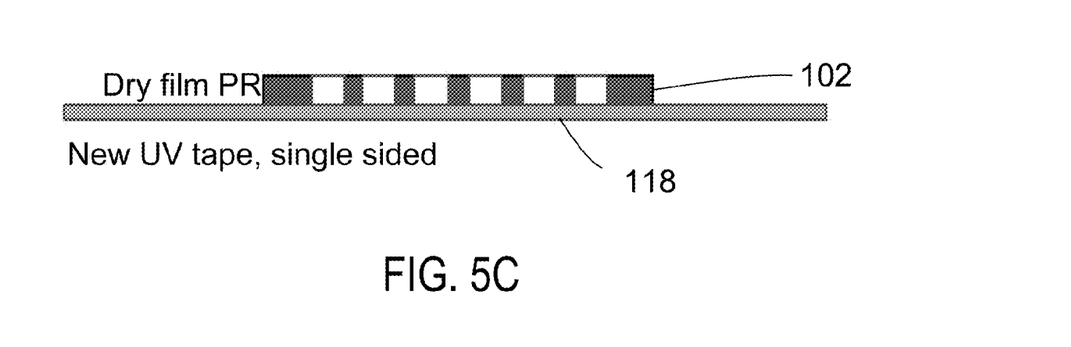

FIGS. 5A-5C illustrate the transfer of the patterned resist layer to a second adhesive tape. In FIG. 5A, the multi-layered structure, including patterned photoresist layer 102, bottom release film 104, and adhesive tape 108, is flipped and attached to second adhesive tape 118. In FIG. 5B, bottom release film 104 and adhesive tape are peeled off. In FIG. 5C, the patterned photoresist film 102 is attached to adhesive tape 118.

Figure 6:
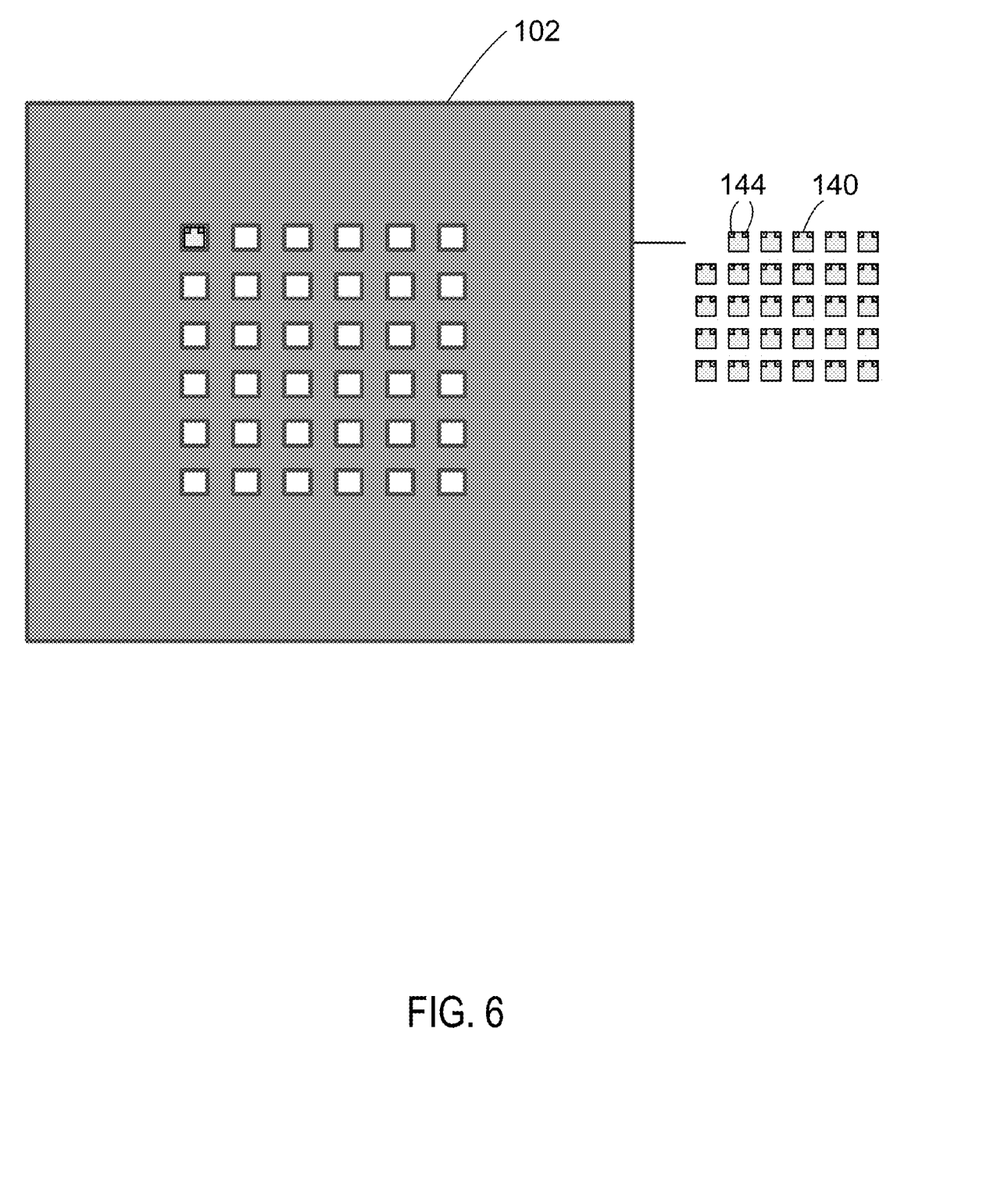
FIG. 6 illustrates the process of LED chips being placed into the grid openings of the template.

In FIG. 6, individual LED chips 140 are placed into the openings of patterned photoresist film 102. For example, a pick-and-place tool can be used to place individual LED chips into the openings of patterned photoresist film 102. An example of pick-and-place tool is a machine made by Datacom. In some embodiments, each LED chip 140 is placed in the center of patterned photoresist film 102, such that the spacing between patterned photoresist film 102 and LED chip 140 on each lateral side of the LED chip is equal to the thickness of phosphor-containing material to be applied in a subsequent step. In the example shown in FIG. 6, the LED chips 140 are shown to have two bonding pad areas 144. In other embodiments, for example in flip-chip packages, the LED chips are placed face down, and the back surface of the chip has no bonding pads.

Figure 7:
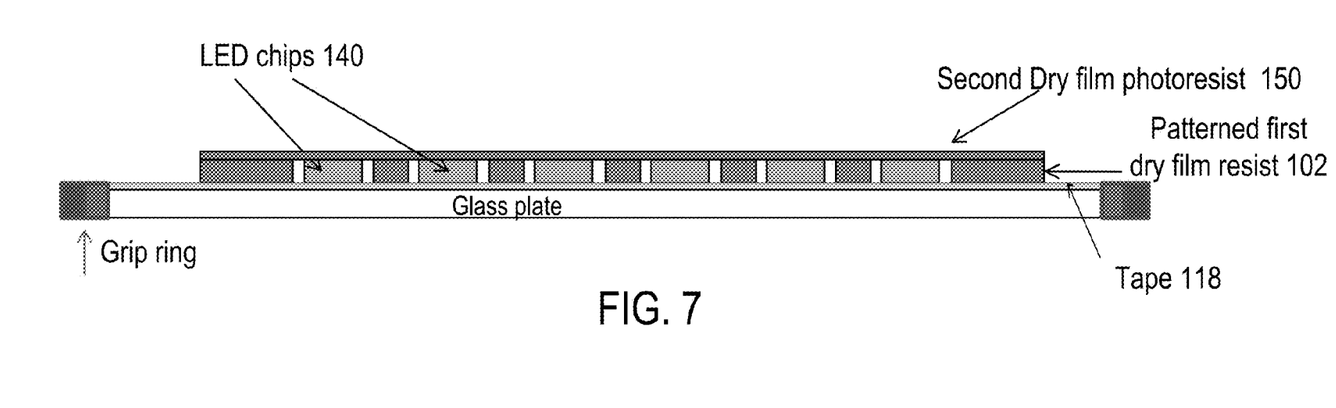
FIGS. 7-9 illustrate a method for forming patterned over the LED dies and the template.

In FIG. 7, a second dry film resist 150 is used to form a stencil over the patterned first dry film resist 102 and LED chips 140. Dry film resist 150 can be selected form the dry film resists described above. After the lower protective layer is peeled off the dry film resist, dry film resist 150 is laid over the patterned first dry film resist 102 and LED chips 140. At this point, dry film resist 150 is in contact with the LED chips 140 and patterned first dry film resist 102. As shown in FIG. 7, the dry resist film can "tent" over the gap between the LED chips and template. In addition, FIG. 7 also shows second dry film resist 150, patterned first dry film resist 102, and LED chips 140 are disposed over a tape 118, which in turn is disposed over a glass plate by a grip ring.

FIG. 8 shows the exposure of dry resist film 150. A photo mask 152, is disposed over the top protective film (which can be a polyester cover) of dry film resist 150 that has been adhered to the LED chips/template. Photo mask 152, for example, can be similar to photomask 114 in FIG. 2 described above with the artwork printed on a transparent film. The ink side of the photo mask is in contact with polyester cover. Next, a UV transparent glass or acrylic plate (not shown) is placed over the top of the photo mark, so that the photo mask can have a smooth and intimate contact with the polyester cover. The exposure can be carried out using a UV light source 190, for example, LED lamp Luxpot alta from LedEngin can provide 400 um UV light. The exposure can be carried out for, e.g., 20 minutes. Subsequently, a post-exposure bake is performed to further assist cross links of the photoresist. In this example, the unexposed regions of the photoresist film are removed using a conventional resist development process.

Figure 9:
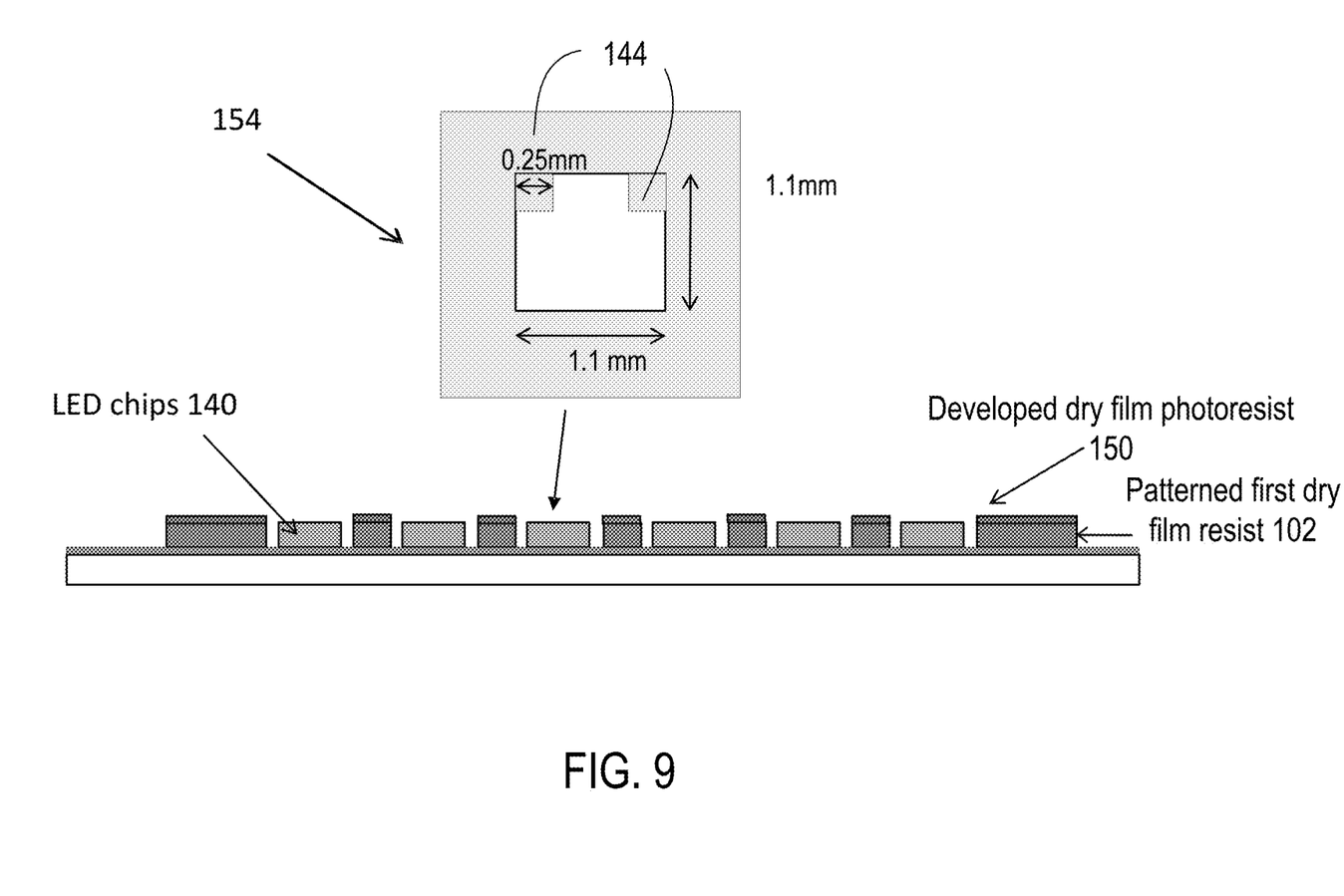

At this point, as shown in FIG. 9, the top surface of the LED dies and the spacing between the LED dies and the patterned first resist layer 102 are exposed. In embodiments in which the back side of the LED dies faces up and has no bond pad areas, the back side is completely exposed. In embodiments in which the LED dies have bond pad areas facing upward, the bond pad areas 144 are now protected by the developed photoresist, as shown in the top view of a die area 154.

Figure 10:
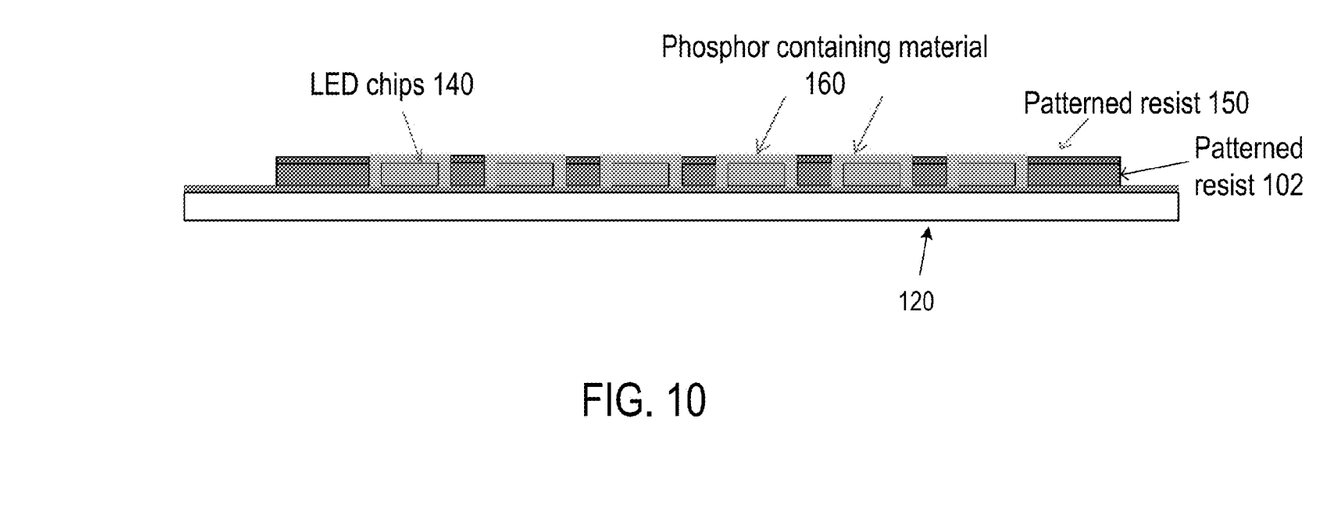
FIG. 10 shows that phosphor material deposited in openings of the photoresist patterns.

In FIG. 10, a phosphor containing mixture 160 is deposited over the patterned stack. As an example, the mixture can be prepared by mixing silicone (e.g., Ker2500), phosphors (e.g., yellow and red phosphors), and diluting solution (e.g., KF-994, cyclotetrasiloxane) to achieve proper viscosity and thixotropy. Here, the mixture can have a higher viscosity that the mixture used in conventional liquid dispensing methods. Therefore, changes in the phosphor mixture caused by settling can be reduced. After the phosphor mixture is applied, a degas procedure can be used to remove bubbles. The mixture is then rolled over photoresist pattern and printed. In some embodiments, the printing is carried out using a screen printing process. The printing can be carried out using, e.g., the printing machine from DEK. After printing, excess silicone/ phosphor/dilutent mixture is removed from the structure. The thickness of the photoresist allows a controlled thickness of the phosphor mixture on the die top. In the examples described above, the lateral thickness of the phosphor-containing material is 0.05 mm. However, other thickness can also be chosen according to the applications.

As described above, FIG. 10 shows an intermediate structure including a glass plate 120, patterned first resist film 150 over the plate, LED chips 140 disposed in openings in the template, a photoresist 150 with a phosphor-containing mixture 160 filling the openings in the photoresist and over the exposed top surface of the LED chips. In some embodiments, this intermediate structure is placed over a hot plate (not shown) to cure the silicone at 120-150 C for 2 minutes. During curing, the photoresist is maintained at the printing position so silicone does not flow and cover the wire bond pads, until silicone/phosphor/dilutent mixture is dried.

As shown in FIG. 10, the sum of the thickness of the first resist layer 102 and the thickness of the second photoresist layer 150 is chosen according to the desired thickness of the phosphor-containing material on top of the LED dies. In some embodiments, the thickness of the first resist layer 102 may be the same as the thickness of the LED die 140. In this case, the thickness of the second photoresist layer 150 is chosen to be the desired thickness of the phosphor-containing material 160 on top of the LED dies. In other embodiments, the sum of the thickness of the first resist layer 102 and the thickness of the second photoresist layer 150 is chosen to be equal to the sum of the LED die and the desired thickness of the phosphor-containing material on top of the LED die. Moreover, the lateral dimension of each of the plurality of openings is chosen to be the desired thickness of the phosphor-containing material on the side or lateral surfaces of the LED dies.

Figure 11:
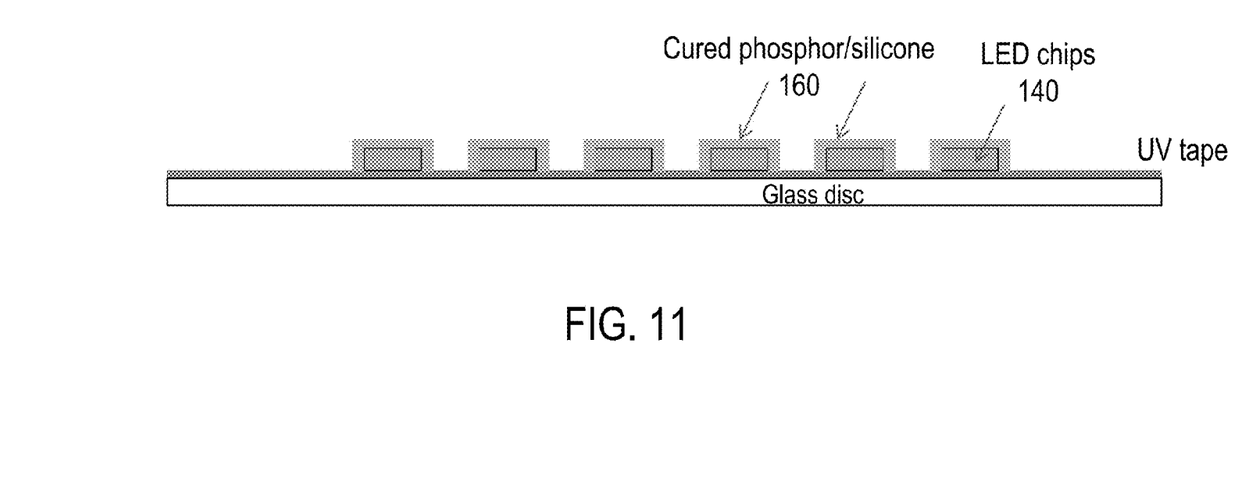
FIG. 11 shows the structure in FIG. 11 with the patterned photoresist and template removed and showing the phosphor-containing material on the top and sidewalls of the LED dies.

In FIG. 11, the photoresist layers are removed. In this step, a suitable photoresist stripping solution, such as those from Dupont or MG Chemical, can be used. Each individual LED die is now covered with a layer of phosphor-containing mixture. In embodiments of the invention, the photoresist stripping solution selectively dissolves the photoresist, and leaves the phosphor-containing material intact. As a result, the method described herein is a controllable and reproducible process for forming a layer of phosphor-containing mixture on the top surface and lateral side surfaces of an LED dies. The desired thicknesses can be reliably obtained as described above in connection with FIG. 10.

A structure shown in FIG. 11 includes a plurality of separate LED dies 140 attached to an adhesive tape 110, each of the LED dies having a layer of phosphor-containing material 160 on the top surface and lateral side surfaces of the die. At this time, the LED dies with phosphor coating 160 are ready for use to form light emitters. A standard assembly process, e.g., using a pick-and-place tool, can be used to install the phosphor-coated LED dies in an emitter package.

Figure 12:
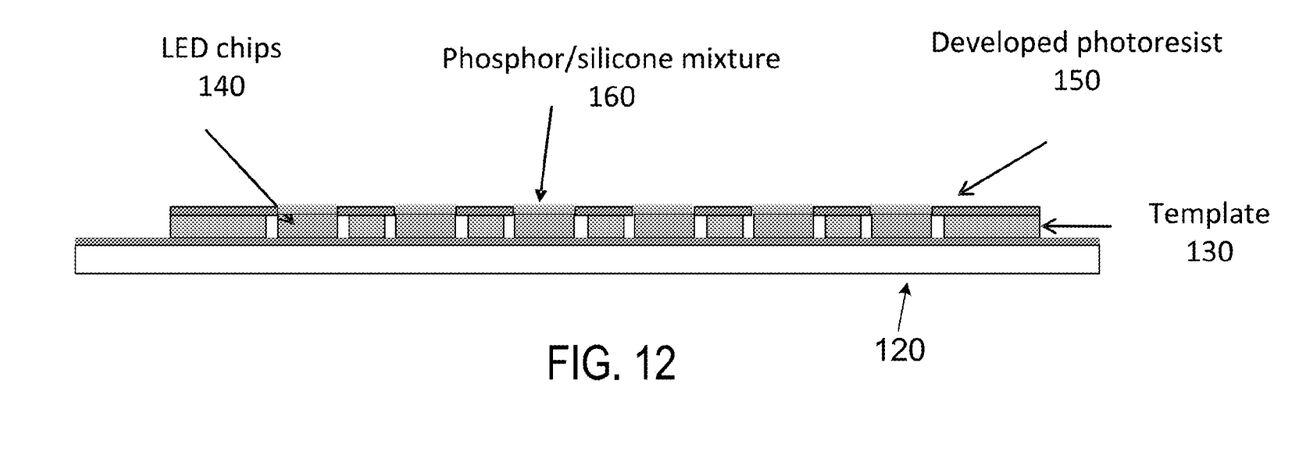
FIGS. 12-15 illustrate a method for forming phosphor-containing material using a template only on the top surface of the LED dies, but not on the lateral side surfaces, according to an alternative embodiment of the invention.
Figure 13:
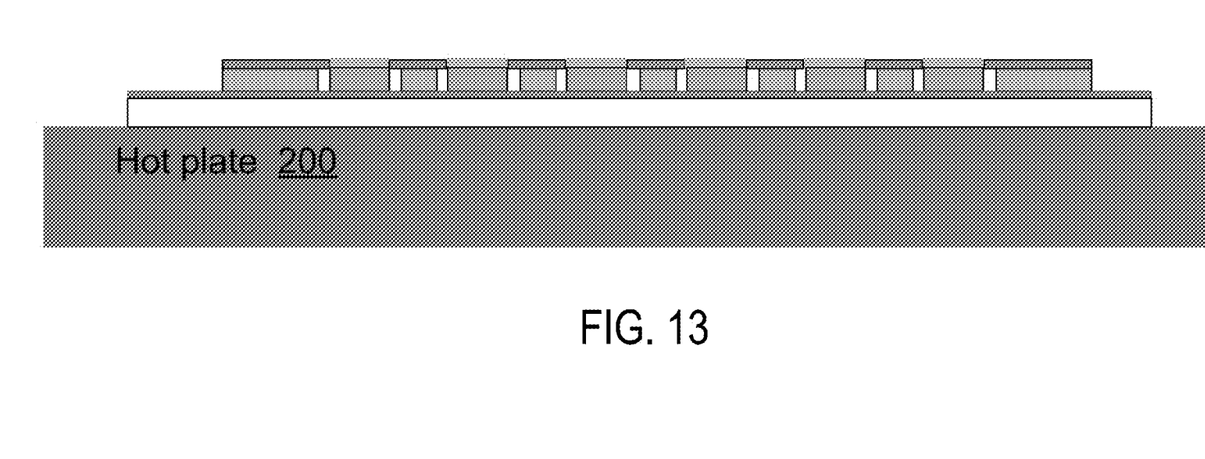

According to other embodiments of the invention, the methods described above can be used to form phosphor-containing material using a template only on the top surface of the LED dies, but not on the lateral side surfaces. An example is illustrated in FIGS. 12-15. As shown in FIG. 12, the openings in the second photoresist layer 150 only expose the top surfaces of the LED dies and prevent the phosphor-containing material from forming on the side surfaces of the LED dies. FIG. 12 shows the intermediate structure including a glass plate 120, a template 130 over the plate, LED chips 140 disposed in openings in the template, a photoresist 150 with a phosphor-containing mixture 160 filling the openings in the photoresist and over the exposed top surface of the LED chips. As shown in FIG. 13, this intermediate structure is placed over a hot plate 200 to cure the silicone at 120-150 C for 2 minutes. During curing, the photoresist is maintained at the printing position so silicone does not flow and cover the wire bond pads, until silicone/phosphor/dilutent mixture is dried.

Figure 14:
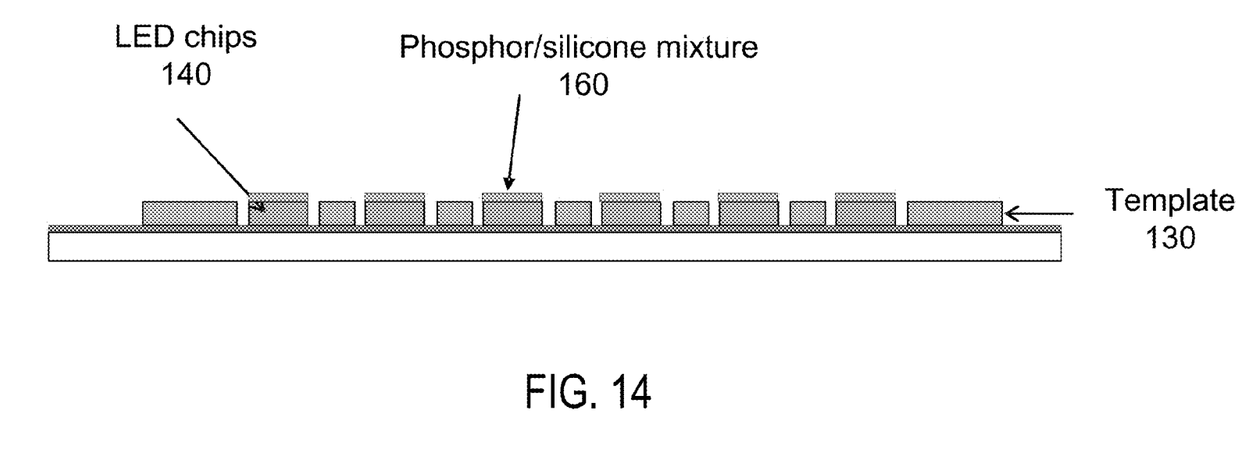
Figure 15:
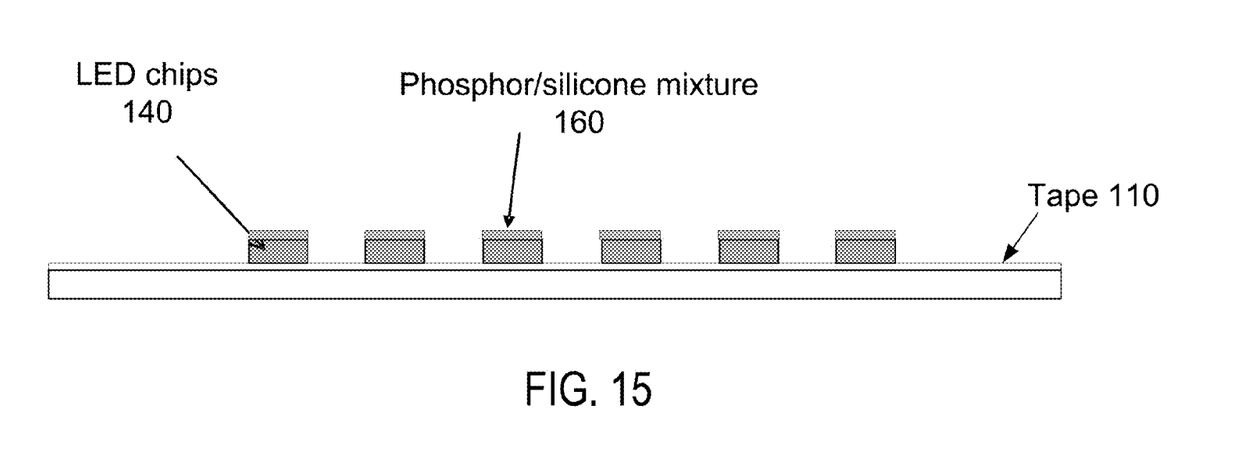

In FIG. 14, the photoresist is removed. As described above, a suitable photoresist stripping solution, such as those from Dupont or MG Chemical, can be used. In FIG. 15, the template is removed, and each individual LED die is now covered with a layer of phosphor-containing mixture. The structure shown in FIG. 14 includes a plurality of separate LED dies 140 attached to an adhesive tape 110, each of the LED dies having a layer of phosphor-containing material 160 on the die top. At this time, a standard assembly process, e.g., using a pick-and-place tool, can be used to install the phosphor-coated LED dies in an emitter package.

In alternative embodiments, the first and the second photoresist layers shown in FIGS. 10 and 12 can be replaced by a single layer of photoresist of a suitable thickness according to the desired thickness of the phosphor-containing layer on the top and lateral surfaces of the LED dies.

In other alternative embodiments, the first and the second photoresist layers shown in FIGS. 10 and 12 can be replaced with pre-made templates or stencils, which are designed to have appropriate thicknesses and openings according to the desired thickness of the phosphor-containing layer on the top and lateral surfaces of the LED dies. After the deposition of the phosphor-containing material, the templates or stencils are removed. In some embodiments, the templates or stencils can be made of a suitable rigid material, such as metal, plastic, Teflon, etc. To prevent the photoresist from sticking to the template or stencil, a non-stick coating can be formed on the template or stencil. In some embodiments, the first and the second photoresist layers shown in FIGS. 10 and 12 can be replaced with a single pre-made template or stencil. Alternatively, either or both of the first and the second photoresist layers shown in FIGS. 10 and 12 can be replaced with pre-made templates or stencils, which are designed to have appropriate thicknesses and openings according to the desired thickness of the phosphor-containing layer on the top and lateral surfaces of the LED dies.

Figure 16:
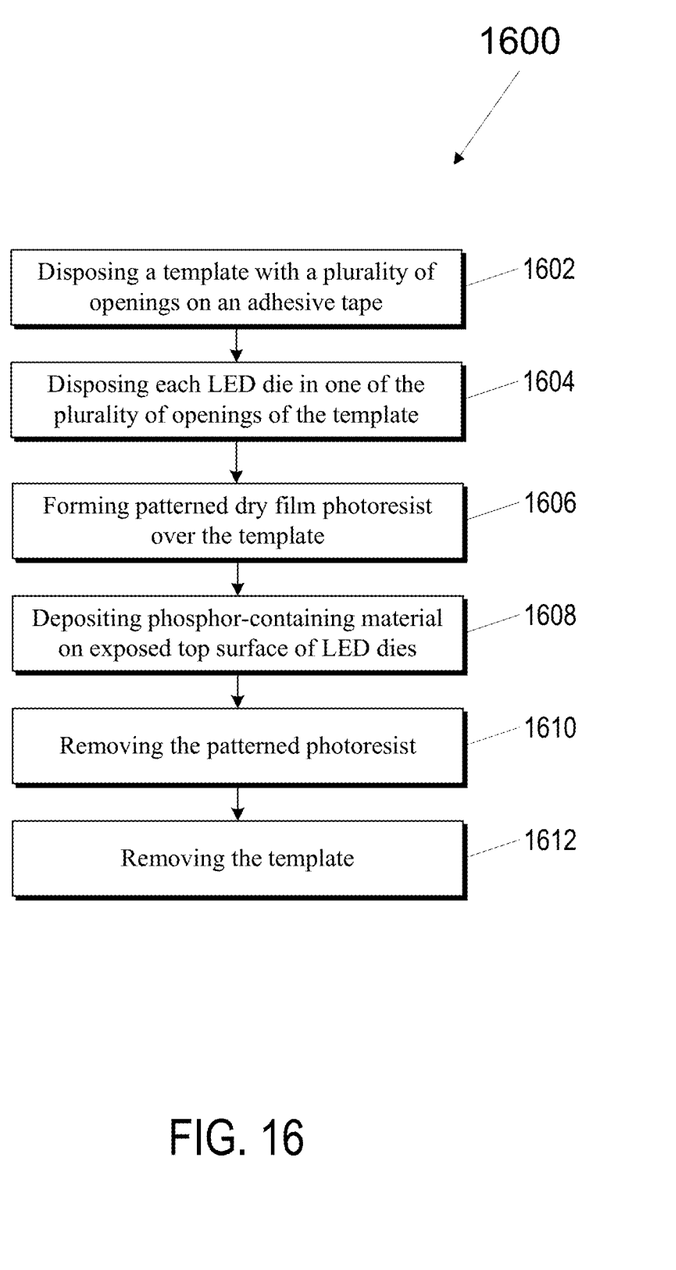
FIG. 16 is a flowchart summarizing the method for depositing a layer of phosphor-containing material on a plurality of LED dies according to an embodiment of the present invention.

FIG. 16 is a flowchart summarizing a method for depositing a layer of phosphor-containing material on a plurality of LED (light-emitting diode) dies according to some embodiments of the present invention. As shown in FIG. 16, the method includes the following processes:

- disposing a template with a plurality of openings on an adhesive tape;
- disposing each of a plurality of LED dies in one of the plurality of openings of the template;
- forming a dry film photoresist layer over the template and the plurality of LED dies, the dry film photoresist layer having a plurality of openings configured to expose a top surface of each of the LED dies;
- depositing a phosphor-containing material on the exposed top surface of each the LED dies;
- removing the photoresist film; and
- removing the template.

Examples of the method are described above in connection with FIGS. 1-15.

As described above in connection with FIGS. 1-15, in some embodiments, the template can be formed by patterning dry film resist and transferring the patterned resist template to an adhesive tape.

In an embodiment, the process of depositing a phosphor-containing material on the top surface of each the LED dies includes:

depositing the phosphor-containing material on the stencil and the LED dies; and removing phosphor-containing material from the top surface of the dry film photoresist layer and on the top surface of the LED dies that protrudes above the top surface of the template.

The methods described above are suitable for phosphor deposition before the die attach and wire bonding steps for the single color multi-die emitters. In addition, in some embodiments, after phosphor printing, each die is tested for light color. Two or more dies of opposite colors (with respect to the average color of all dies) may be selected and attached in a multi-die package.

According to another embodiment of the present invention, a method for depositing a layer of phosphor-containing material on a plurality of LED (light-emitting diode) dies includes:

forming a template structure on a substrate having an adhesive surface, the template structure having a plurality of openings with an LED die in each of the openings;

forming a phosphor-containing material in the openings of the template structure and over a top surface of each the LED dies such that a top surface of the phosphor-containing material is substantially even with a top surface of the template structure; and removing the template, wherein a thickness of the template structure and spacing between the LED dies and the template structure are determined according to desired thicknesses of the phosphor-containing material on the top surface and lateral side surfaces of the LED dies.

In an embodiment of the above method, the template structure comprises photoresist material. In another embodiment, the template structure is configured to allow the template structure to be separated from the phosphor-containing material. In yet another embodiment, the template structure is configured to be chemically separated selectively from the phosphor-containing material. In still another embodiment, the template structure comprises a non-sticking surface that is configured to allow the template structure to be separated from the phosphor-containing material.

According to yet another embodiment, the present invention provides a structure that includes a plurality of separate LED dies attached to an adhesive tape, and each of the LED dies has a layer of phosphor-containing material over a top surface and side surfaces of the LED die.

According to yet another embodiment, the present invention provides a semiconductor device that includes an LED (light-emitting diode) die having a phosphor-containing material on a backside of the LED die. In another embodiment of the semiconductor device, the LED die also has the phosphor-containing material on side surfaces the LED die.

Although the invention has been described with respect to specific embodiments, it will be appreciated that the invention is intended to cover all modifications and equivalents within the scope of the following claims.

What is claimed is:

1. A method for depositing a layer of phosphor-containing material on a plurality of LED (light-emitting diode) dies, the method comprising:

disposing a template of photoresist material with a plurality of openings on an adhesive substrate;

disposing each of a plurality of LED dies in one of the plurality of openings of the template;

forming a photoresist layer over the template and the plurality of LED dies;

patterning the photoresist layer to form a plurality of openings aligned with the plurality of openings in the template plate and configured to expose a top surface and surrounding side surfaces of each of the LED dies;

depositing a phosphor-containing material on the exposed top surface and surrounding side surfaces of each the LED dies such that a top surface of the phosphor-containing material is even with a top surface of the photoresist layer;

removing the patterned photoresist layer and the template such that the plurality of LED dies remains on the adhesive substrate, with the phosphor-containing material covering the top surface and surrounding side surfaces of each of the LED dies.

2. The method of claim 1, wherein a sum of the thickness of the template and the thickness of the photoresist layer is equal to a desired thickness of the phosphor-containing material on top of the LED dies.

3. The method of claim 1, wherein a lateral dimension of each of the plurality of openings is chosen to allow a desired thickness of the phosphor-containing material on the side surfaces of the LED dies.

4. The method of claim 1, wherein disposing a template of photoresist material comprises:

disposing a layer of dry film photoresist sandwiched between a top and a bottom protective films on a glue side of a single-sided support adhesive tape;

patterning the layer of dry film resist using a photomasking process;

attaching the patterned dry film to the adhesive substrate; and removing the bottom support film and the support adhesive tape from the patterned dry film resist, and leaving the template of patterned dry film resist on the adhesive substrate.

5. The method of claim 4, wherein patterning the layer of dry film resist comprises:

disposing a photomask over the layer of dry photoresist film;

exposing the dry photoresist film with a light source;

removing the top protective film; and developing the exposed dry photoresist film to form the plurality of openings.

6. The method of claim 1, wherein removing the patterned photoresist layer and the template comprising using a photoresist stripping solution.

7. The method of claim 1, wherein the adhesive substrate comprises an adhesive tape disposed on a glass plate.

8. The method of claim 1, wherein the support adhesive tape is a heat release tape.

9. The method of claim 1, wherein the support adhesive tape is a UV release tape.

10. The method of claim 1, wherein an area of each of the openings in the template is approximately equal to the size of the LED dies plus the thickness of the phosphor-containing material on the side surfaces of the LED dies.

11. The method of claim 1, wherein the patterned photoresist layer is configured to cover bond pad areas on the LED dies.

12. The method of claim 1, wherein each of the plurality of LED dies is disposed with a front side face down in one of the plurality of openings of the template, wherein the front side of the die includes bond pad regions.

13. The method of claim 1, wherein depositing the phosphor-containing material comprises:

depositing the phosphor-containing material on the patterned photoresist layer and the LED dies; and removing excess phosphor-containing material from the top surface of the photoresist layer and on the top surface of the LED dies that protrudes above the top surface of the patterned photoresist layer.

14. The method of claim 1, wherein depositing the phosphor-containing material in the plurality of openings comprises using a screen printing process.

15. A method for depositing a layer of phosphor-containing material on a plurality of LED (light-emitting diode) dies, the method comprising:
- disposing a first layer of dry film photoresist sandwiched between a top and a bottom protective films on a first adhesive tape which is mounted on a substrate;
- patterning the first layer of dry film resist using a photomasking process to form a plurality of openings;
- attaching the patterned first layer of dry film resist to a second adhesive tape;
- separating the bottom protective film and the first adhesive tape from the patterned dry film resist, leaving a template of patterned dry film resist on the second adhesive tape;
- disposing each of a plurality of LED dies in one of the plurality of openings of the template;
- disposing a second dry film resist on the template and the plurality of LED dies;
- patterning the second dry film resist to form a plurality of openings aligned with the plurality of openings in the template and configured to expose a top surface and surrounding side surfaces of each of the LED dies;
- depositing a phosphor-containing material on the exposed top surface and surrounding side surfaces of each the LED dies such that a top surface of the phosphor-containing material is even with a top surface of the photoresist layer;
- removing the second dry film resist and the template such that the plurality of LED dies remains on the adhesive substrate, with the phosphor-containing material covering the top surface and surrounding side surfaces of each of the LED dies.

16. The method of claim 15, wherein a sum of the thickness of the template and the thickness of the photoresist layer is chosen to be the desired thickness of the phosphor-containing material on top of the LED dies.

17. The method of claim 15, wherein a lateral dimension of each of the plurality of openings is chosen to allow a desired thickness of the phosphor-containing material on the side surfaces of the LED dies.

18. The method of claim 15, wherein depositing the phosphor-containing material comprises using a screen printing process.

\* \* \* \* \*